United States Patent [19]

Ishimaru et al.

[11] Patent Number: 4,499,163
[45] Date of Patent: Feb. 12, 1985

[54] SOLDERING MASK FORMED FROM A PHOTOSENSITIVE RESIN COMPOSITION AND A PHOTOSENSITIVE ELEMENT

[75] Inventors: Toshiaki Ishimaru; Katsushige Tsukada; Nobuyuki Hayashi; Shigeru Koibuchi; Asao Isobe, all of Hitachi, Japan

[73] Assignee: Hitachi Chemical Company, Ltd., Tokyo, Japan

[21] Appl. No.: 512,660

[22] Filed: Jul. 11, 1983

Related U.S. Application Data

[63] Continuation of Ser. No. 303,524, Sep. 18, 1981, abandoned.

[30] Foreign Application Priority Data

Sep. 19, 1980 [JP] Japan ............................... 55-131322
Oct. 1, 1980 [JP] Japan ............................... 55-137930

[51] Int. Cl.$^3$ .......................... G03C 5/00; G03C 1/78
[52] U.S. Cl. ........................................ 430/5; 430/284; 430/325; 430/396; 430/330; 430/531
[58] Field of Search .................. 430/284, 5, 396, 325, 430/330, 531

[56] References Cited

U.S. PATENT DOCUMENTS

| | | | |
|---|---|---|---|
| 3,850,770 | 11/1974 | Juna et al. | 430/284 |
| 3,930,865 | 1/1976 | Faust et al. | 430/275 |
| 4,210,713 | 7/1980 | Sumiyoshi et al. | 430/284 |
| 4,228,232 | 10/1980 | Rousseau | 430/284 |
| 4,247,576 | 1/1981 | Kotner | 430/272 |
| 4,250,248 | 2/1981 | Faust | 430/284 |
| 4,268,611 | 5/1981 | Okishi et al. | 430/272 |

*Primary Examiner*—Jack P. Brammer
*Attorney, Agent, or Firm*—Antonelli, Terry & Wands

[57] ABSTRACT

A photosensitive resin composition comprising (a) 20 to 75 parts by weight of a urethane diacrylate or dimethacrylate compound obtained by reacting trimethylhexamethylene diisocyanate and/or isophorone diisocynate dihydric alcohol and an acrylic or methacrylic monoester of a dihydric alcohol, (b) 20 to 75 parts by weight of a linear polymeric compound having a glass transition temperature of about 40° to 150° C., and (c) a sensitizer and/or a sensitizer system which generate free radicals owing to actinic light, is excellent in heat resistance, resistance to thermal shock and solvent resistance, and is suitable for forming a soldering mask. Further, a photosensitive element produced by forming a layer of the above-mentioned composition on a support gives a protective coating film excellent in heat resistance, resistance to thermal shock and solvent resistance, and is particularly suitable for a soldering mask.

28 Claims, 5 Drawing Figures

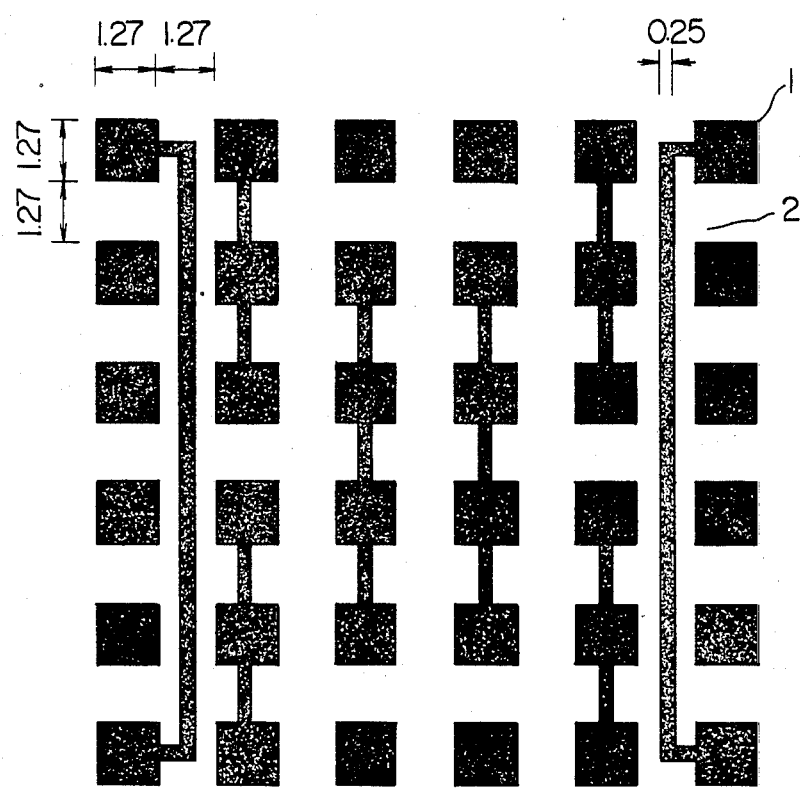
F I G. 1

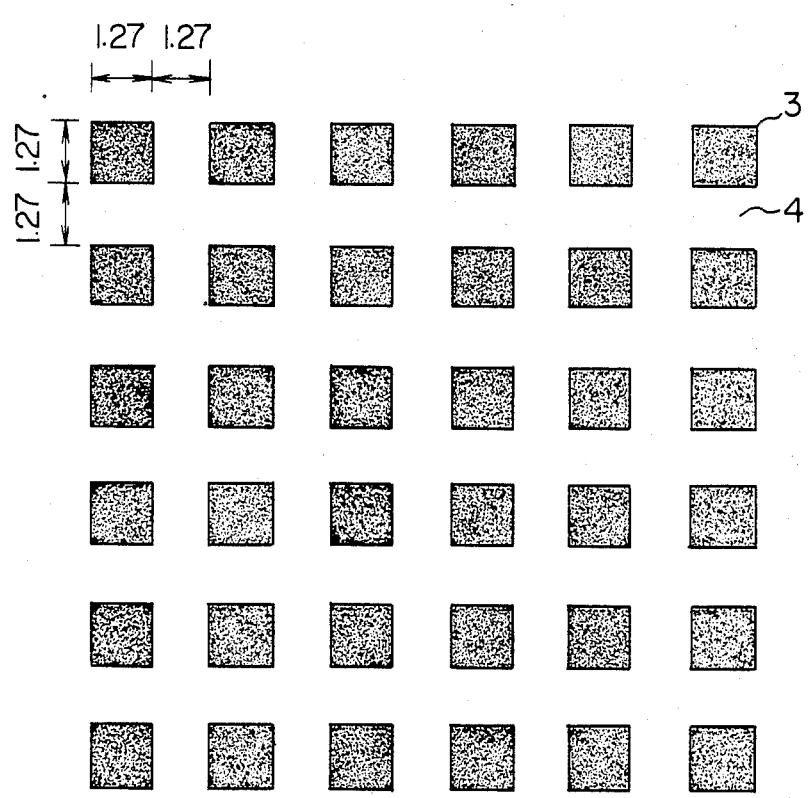
F I G. 2

SOLDERING MASK FORMED FROM A PHOTOSENSITIVE RESIN COMPOSITION AND A PHOTOSENSITIVE ELEMENT

This is a continuation of application Ser. No. 303,524, filed Sept. 18, 1981, now abandoned.

This invention relates to a photosensitive resin composition and a photosensitive element. More particularly it relates to a photosensitive resin composition for forming a protective coating film having excellent characteristics which can be used, for example, for producing a printed wiring board and for metal precise processing, and to a photosensitive element comprising a layer of said composition and a support film supporting said layer.

It is well known that photosensitive elements, i.e., device comprising a support film and a layer of substantially dried photosensitive resin composition formed thereon are used as a photoresist for producing a printed wiring board. Further, it is also widely known that photosensitive resin compositions having excellent characteristics which can be used in a soldering mask, a resist for chemical plating, and the like are very useful.

Main objects of a soldering mask are to limit a soldering region at the time of soldering to prevent soldering bridge and the like; to prevent corrosion of a naked copper conductor, and to keep electric insulation between conductors. For these objects, thermosetting ink such as epoxy resin or the like, or photosetting ink has heretofore been screen-printed. However, in recent years, a wiring density of a printing board has been increased, and a soldering mask used for it has become difficult with respect to precision to form by a screen-printing method. With improvement in wiring density, electric insulation between conductors has come to be more severely required, and the thickness of a conductor-protecting film has come to be required to be at least about 20 μm or more. When a screen-printing method is used, the average thickness of a resist which can be formed at a time is at most 30 μm, and the thickness of the thinnest part of a resist formed on the projecting part of a conductor becomes 10 μm or less inevitably. When printing is repeated two or three times, a thick film can be obtained, however it is substantially very difficult with respect to printing precision and because of complication of processes. Therefore, the advent of a photosensitive element for forming a soldering mask is desired. Photosensitive elements in which the thickness of a layer of a photosensitive resin composition is 20 μm or more are useful. Since the thickness of a conductor in most printed wiring is 18 μm or more, photosensitive elements in which the thickness of a layer of a photosensitive resin is 40 μm or more are particularly useful.

In general, photosensitive elements for etching or electrolytic plating which are called photosensitive dry films and used for forming a conductor pattern of a printed wiring board are not sufficient in heat resistance, and hence cannot be used for forming a soldering mask.

Accordingly, there have been put forward many proposals on a photosensitive resin composition for a photosensitive element good in heat resistance which can be used for forming a soldering mask (for example, Japanese Patent Appln. Kokai (Laid-Open) No. 56018/78 (U.S. Patent Appln. Ser. No. 735,979 filed Oct. 27, 1976 now abandoned), Japanese Patent Appln. Kokoku (Post-Exam Publn) No. 43,092/77 and Japanese Patent Appln. Kokoku (Post-Exam. Publn) No. 44,346/78 (U.S. Patent Appln. Ser. No. 782,378 filed Mar. 29, 1977 now U.S. Pat. No. 4,272,607). The photosensitive resin compositions in these proposals are excellent in heat resistance which is one of the objects of the proposals; however when a thick protective film of 40 μm or more in thickness is formed from the compositions, the film cracks within 5 cycles in a thermal shock test holding at 125° C. then holding at −65° C. repeatingly (MIL-STD-202E method 107D condition B). The thicker the film becomes, the more seriously the film cracks. This becomes a serious problem when the long time reliability of a printed wiring board should be taken into consideration.

Among soldering masks formed by a screen-printing method, there are those which are good in resistance to thermal shock. This is mainly because the thickness of soldering masks formed by a screen-printing method is 10 to 30 μm. Another reason is that printing ink generally contains a large amount of a filler. It is well known that the presence of the filler contributes to improvement in the resistance to thermal shock. However, in the case of a photosensitive element, its layer of a photosensitive resin composition should substantially be dried before irradiation with actinic light, and should have any filminess. This means that the layer of a photosensitive resin composition is required to surely contain a linear high-molecular compound for endowment with filminess as one of the objects. Therefore, said layer is difficult to be incorporated with a large amount of a filler in addition to a linear high-molecular compound, an actinic-light-sensitive compound and a sensitizer.

Further, the present inventors have done various researches to find that when a layer of a photosensitive resin composition of a photosensitive element is incorporated with about 10% by weight of a filler, the element gives a soldering mask that is improved in resistance to thermal shock but that is deteriorated in soldering-heat-resistance which is one of the main characteristics of the mask, and hence it is not practical.

As compounds used in photosetting ink for screen printing, various urethane acrylate compounds or urethane methacrylate compounds (hereinafter referred to as "urethane (meth)acrylate compounds") have been proposed as those which are excellent in heat resistance. However, great difficulty is raised when these compounds are used not in photosetting ink but in the photosensitive element usually accompanied by imagewise exposure and development which is an object of this invention. A first difficulty is that many of the proposed urethane (meth)acrylate compounds are not miscible or are very poorly miscible with linear high-molecular compounds, particularly vinyl series copolymeric linear high-molecular compounds. A second difficulty is that many of the proposed urethane (meth)acrylate compounds are insoluble in noncombustible solvents used for the development of a photosensitive element, particularly in 1,1,1-trichloroethane series solvent which is generally most often used. Urethane (meth)acrylate compounds free from these difficulties are disclosed in Japanese Patent Appln Kokoku (Post-Exam Publn) No. 15,733/76. However, the compositions disclosed therein cannot be used for forming a soldering mask because of their insufficiency in flexibility, heat resistance, and the like.

This invention is to provide a photosensitive resin composition excellent in heat resistance and resistance to thermal shock which can be used for forming a soldering mask, and a photosensitive element comprising a layer of said composition and a support film supporting said layer.

This invention provides a photosensitive resin composition comprising (a) 20 to 75 parts by weight of an urethane diacrylate compound or an urethane dimethacrylate compound (hereinafter referred to as "urethane di(meth)acrylate compound") obtained by reacting, (i) at least one diisocyanate compound selected from the group consisting of isophorone diisocyanate and trimethylhexamethylene diisocyanate, (ii) a dihydric alcohol and (iii) an acrylic monoester or a methacrylic monoester (hereinafter referred to as "(meth)acrylic monoester") of a dihydric alcohol, (b) 20 to 75 parts by weight of a linear high-molecular (or polymeric) compound having a glass transition temperature of about 40° to 150° C., and (c) a sensitizer and/or a sensitizer system which generate free radicals owing to actinic light.

Further, this invention provides a photosensitive element comprising a layer of the photosensitive resin composition mentioned above, i.e., comprising (a) 20 to 75 parts by weight of a urethane di(meth)acrylate compound obtained by reacting (i) isophorone diisocyanate and/or trimethylhexamethylene diisocyanate, (ii) a dihydric alcohol and (iii) a (meth)acrylic monoester of a dihydric alcohol, (b) 20 to 75 parts by weight of a linear high-molecular comound having a glass transition temperature of about 40° to 150° C., and (c) a sensitizer and/or a sensitizer system which generate free radicals owing to actinic light; and a support film supporting said layer.

In the attached drawings,

FIG. 1 shows a copper pattern of test substrates used in the Examples;

FIG. 2 shows a negative mask for the test used in the Examples;

Figure 3:
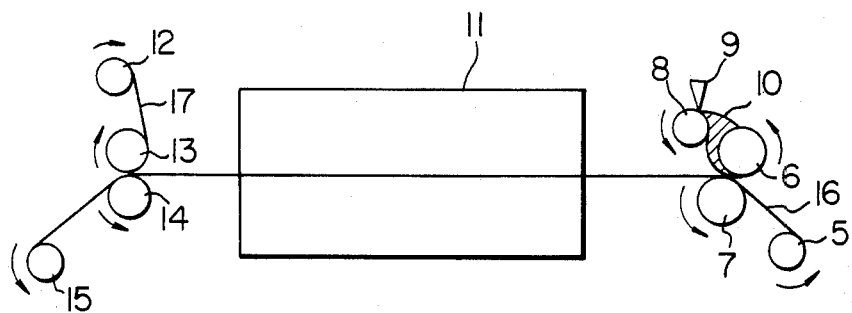
FIG. 3 is a sketch of an apparatus for producing photosensitive elements used in the Examples.

The photosensitive resin composition of this invention is explained below in detail.

The photosensitive resin composition of this invention contains as an indispensable component a urethane di(meth)acrylate compound (a) obtained by reacting (i) at least one diisocyanate compound selected from the group consisting of isophorone diisocyanate and trimethylhexamethylene diisocyanate, (ii) a dihydric alcohol and (iii) a (meth)acrylic monoester of a dihydric alcohol.

As the diisocyanate compound (i), there may be used isophorone diisocynate (IPDI) manufactured by, for example, Veba Chemie Co., Ltd. (West Germany), and trimethylhexamethylene diisocyanate (TMDI), which is a mixture of 2,2,4-trimethylhexamethylene diisocyanate and 2,4,4-trimethylhexamethylene diisocyanate. IPDI and TMDI can be used alone or as a mixture thereof.

As the dihydric alcohol of (ii) and that in (iii), there can be used methylene glycol, ethylene glycol, diethylene glycol, triethylene glycol, tetraethylene glycol, propylene glycol, dipropylene glycol, 1,4-butanediol, 1,3-butanediol, 2,3-butanediol, 1,5-pentanediol, 1,6-hexanediol, 1,10-decanediol, neopentyl glycol, 1,4-cyclohexane dimethanol, bis(2-hydroxyethyl)terephthalate, 2,2-bis(4-hydroxyethoxyphenyl)propane, 2,2-bis(4-hydroxydiethoxyphenyl)propane, and the like.

As the (meth)acrylic monoester of a dihydric alcohol, there can be used 2-hydroxyethyl (meth)acrylate, 2-hydroxypropyl (meth)acrylate, 1,4-butanediol mono(meth)acrylate, 1,3-butanediol mono(meth)acrylate, and the like.

The dihydric alcohol of (ii) and that in (iii) may be the same or different. The obtained urethane di(meth)acrylate can be represented by the following formula:

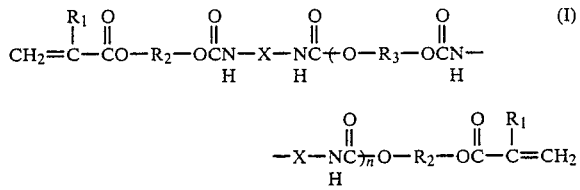

In the formula (I), $R_1$ is H or $CH_3$; $R_2$ is a residue of a dihydric alcohol; $R_3$ is a residue of a dihydric alcohol; X is a residue of isophorone diisocyanate or a trimethylhexamethylene group; and n is zero or an integer preferably from 1 to 3. The actually obtained reaction product is a mixture of urethane di(meth)acrylate compounds in which the values of n are different.

When the urethane di(meth)acrylate compound of this invention is synthesized, the reaction is usually effected at a temperature from 40° to 100° C., and it is preferable to determine the amounts of the isocyanate compund (i), the dihydric alcohol (ii) and the (meth)acrylic monoester of a dihydric alcohol (iii), so as to effect the reaction so that the isocyanate equivalent of the diisocyanate compound (i) may be almost equal to the alcohol equivalent of the sum of the dihydric alcohol (ii) and the (meth)acrylic monoester of a dihydric alcohol (iii). However, the isocyanate equivalent may be a little over or a little below the alcohol equivalent. When the isocyanate equivalent is a little over the alcohol equivalent, the excess isocyanate groups are finally reacted with a monohydric alcohol such as methanol, whereby the free isocyanate groups can be eliminated.

When the ratio of the alcohol equivalent of the dihydric alcohol (ii) to be reacted to the alcohol equivalent of the (meth)acrylic monoester of a dihydric alcohol (iii) is adjusted to 1 (provided that the isocyanate equivalent of the diisocyanate compound to be reacted is made almost equal to the total alcohol equivalent), the numerical average value of n becomes 1.

When a dihydric alcohol having a large number of constituting carbon atoms is used, the formed soldering mask is improved in resistance to thermal shock but deteriorated in heat resistance. When a dihydric alcohol having a small number of constituting carbon atoms is used, the formed soldering mask is further improved in heat resistance, but lowered in resistance to thermal shock. The number of the constituting carbon atoms of the dihydric alcohol of (ii) and that in (iii) is preferably 1 to 23. It is possible to improve the lowering in heat resistance in the case of using a dihydric alcohol having a large number of constituting carbon atoms. That is to say, the lowering in heat resistance can be prevented by adjusting the alcohol equivalent of the dihydric alcohol (ii) to be reacted, so as to be less than the alcohol equivalent of the (meth)acrylic monoester of a dihydric alcohol (iii) (provided that the isocyanate equivalent of the diisocyanate compound to be used is made equal to the total alcohol equivalent), and thereby adjusting the numerical average value of n so as to be 1 or less.

The deterioration in resistance to thermal shock in the case of using a dihydric alcohol having a small number of constituting carbon atoms can similarly be prevented. That is to say, the deterioration in resistance to thermal shock can be prevented by adjusting the alcohol equivalent of the dihydric alcohol (ii) to be reacted, so as to be more than the alcohol equivalent of the (meth)acrylic monoester of a dihydric alcohol (iii) (provided that the isocyanate equivalent of the diisocyanate compound to be used is made equal to the total alcohol equivalent), and thereby adjusting the numerical average value of n so as to be more than 1. That is to say, when the balance between heat resistance and resistance to thermal shock is taken into consideration, there is a preferable range of the concentration of the acryloyl group or the methacryloyl group (hereinafter referred to as "(meth)acryloyl group").

The present inventors have done various researches to find that a soldering mask formed by using a photosensitive resin composition obtained by the use of a urethane di(meth)acrylate compound (mixture) containing (meth)acryloyl groups in an amount of $1 \times 10^{-3}$ to $4.3 \times 10^{-3}$ equivalent/g is excellent in balance between the heat resistance and the resistance to thermal shock.

When the resistance to electrolytic corrosion of a printed wiring board in which a conductor is protected by a soldering mask is taken into consideration, dihydric alcohols containing no hydrophilic group such as an ether bond or the like in the residues, for example, 1,4-butanediol, 1,3-butanediol, 1,5-pentanediol, 1,6-hexanediol, 1,4-cyclohexane dimethanol, and the like are preferred as the dihydric alcohol (ii) to be reacted.

The urethane di(meth)acrylate compound content ranges from 20 to 75 parts by weight from a consideration of the heat resistance and the resistance to thermal shock.

The photosensitive resin composition of this invention contains as an indispensable component a linear high-molecular compound (b) having a glass transition temperature of about 40° to 150° C.

When the glass transition temperature is lower than about 40° C., the heat-resistance of the formed soldering mask is low. When the glass transition temperature exceeds about 150° C., the miscibility of said compound (b) with the urethane di(meth)acrylate compound is lowered, so that it becomes impossible to form a layer of the photosensitive resin composition on a support film or a substrate. As the linear high polymer of the (b) component, there may be used a thermoplastic polymer disclosed in Japanese Patent Appln Kokoku (Post-Exam Publn) No. 15,932/66 (U.S. patent appln. Ser. No. 274,909 filed Apr. 23, 1963) now U.S. Pat. No. 3,261,686. There may be used, for example, vinyl series linear polymers or copolymers, copolyesters, polyamides, vinylidene chloride copolymers, synthetic rubbers, and the like. Vinyl series linear copolymers are preferred from the viewpoint of miscibility with the urethane di(meth)acrylate compound and adhesion between the printed wiring substrate and the layer of a photosensitive resin composition, though vinyl series homopolymers may be used. As the copolymerization component of the linear high-molecular compounds, various vinyl monomers may be used. Suitable examples of the vinyl monomers include methyl methacrylate, butyl methacrylate, ethyl acrylate, styrene, α-methylstyrene, vinyltoluene, 2-hydroxyethyl methacrylate, 2-hydroxypropyl methacrylate, 2-hydroxyethyl acrylate, acrylic acid, methacrylic acid, glycidyl methacrylate, t-butylaminoethyl methacrylate, 2,3-dibromopropyl methacrylate, 3-chloro-2-hydroxypropyl methacrylate, acrylamide, acrylonitrile, and the like.

If the formed soldering mask is required to be flame-retardant, monomers containing one or more bromine atoms may be used as the copolymerization component. The content of the bromine atoms in the linear high-molecular compound is suitably up to 40% by weight, and when it exceeds 40% by weight, there is a tendency that the resistance to thermal shock is lowered. As the monomers containing one or more bromine atoms, tribromophenyl (meth)acrylate (this means tribromophenyl acrylate or tribromophenyl methacrylate; and also used hereinafter) is preferred. When the copolymerized amount of tribromophenyl (meth)acrylate is less than 5% by weight, there is little difference in its effect on the flame retardancy between a compound in which it is copolymerized and a compound in which it is not copolymerized. When the copolymerized amount exceeds 65% by weight, the resistance to thermal shock is lowered. The use of antimony trioxide in the photosensitive resin composition is effective for the flame-retardancy. However, when the antimony trioxide content in the photosensitive resin composition exceeds 5% by weight, there is brought about disadvantageous effects on the heat resistance and the like of the formed soldering mask.

The content of the linear high-molecular polymer in the photosensitive resin composition ranges from 20 to 75 parts by weight from the viewpoint of the heat resistance and the resistance to thermal shock.

The photosensitive resin composition of this invention contains as an indispensable component a sensitizer and/or a sensitizer system (c) which generates free radicals owing to actinic light. Examples of the sensitizer include substituted and unsubstituted polynuclear quinones such as 2-ethylanthraquinone, 2-t-butylanthraquinone, octamethylanthraquinone, 1,2-benzanthraquinone, 2,3-diphenylanthraquinone, and the like; ketoaldonyl compounds such as diacetyl, benzyl, and the like; α-ketoaldonyl alcohols and ethers such as benzoin, pivalone, and the like; α-hydrocarbon-substituted aromatic acyloins such as α-phenylbenzoin, α,α-diethoxyacetophenone, and the like; and aromatic ketones such as benzophenone, 4,4'-bisdialkylaminobenzophenone, and the like. These may be used alone or in combination of two or more of them. The term "sensitizer system" used herein refers to a combination of a sensitizer and a sensitizing assistant, and as examples of the combination, there are combination of 2,4,5-triarylimidazole dimer and 2-mercaptobenzoquinazole, leucocrystal violet, tris(4-diethylamino-2-methylphenyl)methane, or the like. There may be used additives which have no photoinitiating property by itself but can constitute a good sensitizer system excellent in photoinitiating property as a whole when used in combination with the above-mentioned materials. The additives are, for example, tertiary amines such as triethanolamine and the like which are used in combination with benzophenone. These sensitizers and/or sensitizer systems are contained preferably in an amount of 0.5 to 10% by weight based on the sum of amounts of the above-mentioned (a) urethane di(meth)acrylate compound and (b) linear high-molecular compound.

The photosensitive resin composition of this invention may contain other photopolymerizable unsaturated compounds. As the other photopolymerizable unsaturated compounds, there may be exemplified trimethylolpropane triacrylate, pentaerythritol triacrylate, tetraethyleneglycol diacrylate, and the like.

There may also be used polymerizable unsaturated compounds disclosed in Japanese Patent Application Kokai (Laid-Open) No. 56,018/78 (U.S. Patent Appln. Ser. No. 735,979 filed Oct. 27, 1976). However, the content of these other photopolymerizable unsaturated compounds is preferably 20% by weight or less, particularly preferably 10% by weight or less based on the total amounts of the above-mentioned (a) urethane di(meth)acrylate compound and (b) linear high-molecular compound from a consideration of balance between the heat resistance and the resistance to thermal shock. The other photopolymerizable unsaturated compounds may be added in order to improve other characteristics such as the solvent resistance, the adhesion, and the like, and (meth)acrylic esters (this means acrylic esters or methacrylic esters; and also used hereinafter) containing a phosphoric acid group in the molecule are preferable for further improving the adhesion between the formed soldering mask and the printed wiring substrate.

Examples of the (meth)acrylic esters containing a phosphoric acid group include PM-1, PM-2, PA-1 and PA-2 in KAYAMER ® series manufactured by Nihon Kayaku Co., Ltd., Phosmer M ® (acid phosphoxyethyl methacrylate), Phosmer CL ® (3-chloro-2-acid phosphoxypropyl methacrylate) manufactured by Fats and Oils Articles Co., Ltd., etc. The content of these (meth)acrylic esters containing in the molecule a phosphoric acid group is preferably 0.01 to 5% by weight based on the total amounts of the above-mentioned (a) urethane di(meth)acrylate compound and (b) linear high-molecular compound.

Further, the photosensitive resin composition of this invention may contain other secondary components. The secondary components include thermopolymerization inhibitors, dyes, pigments, coating property improvers, and the like, and these are selected with the same consideration as in the case of ordinary photosensitive resin compositions.

Next, the photosensitive element of this invention is explained below in detail.

Figure 4:
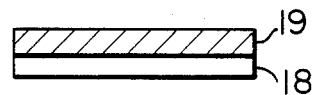
FIGS. 4 and 5 are cross-sectional views showing examples of the photosensitive elements of this invention.

The photosensitive element of this invention can be obtained by forming a layer 19 of the photosensitive resin composition explained above in detail on a support film 18 as shown in FIG. 4. The layer of the photosensitive resin composition can be formed on a support film by a conventional process. For example, it can be formed by uniformly dissolving the photosensitive resin composition in an organic solvent such as methyl ethyl ketone, toluene, methylene chloride, or the like (or dispersing it thereinto when a flame-retarding assistant such as antimony trioxide, a pigment, or the like is used), applying the resulting solution onto said support film by a knife coating method, a roll coating method, or the like, and then drying the solution. The amount of the remaining solvent in the photosensitive layer is limited to preferably 2% by weight or less, particularly preferably 1% by weight or less.

It is preferable that the support film used in this invention has heat resistance and solvent resistance which are necessary at the time of the production of the photosensitive element. The support film may be either pervious or not pervious to actinic light. Preferable examples of the support film include well-known films such as a polyester film, a polypropylene film, a polyimide film, a polyamide-imide film, a polystyrene film and the like.

Figure 5:
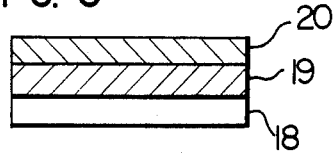

When a long photosensitive element is produced, said element is wound into a roll in the final step of the production. In this case, the layer of the photosensitive resin composition can be prevented from adhering to the back side of the support film in winding the element into a roll, by using a support film whose back side has been treated by a method well known in the field of a pressure-sensitive sticking tape and the like. It is preferable to laminate a covering film 20 as shown in FIG. 5 which can be peeled off on the layer of a photosensitive resin composition of said element, for the same object as above, an object of preventing the adhesion of dust, etc.

As examples of the covering film which can be peeled off, there are a polyethylene film, a polypropylene film, a Teflon film, surface-treated paper, and the like, and any covering film may be used so long as adhesion between it and the layer of a photosensitive resin composition is lower than adhesion between the layer of a photosensitive resin composition and the support film when it is peeled off.

The thickness of the layer of a photosensitive resin composition constituting the photosensitive element of this invention is preferably 20 to 200 $\mu$m for keeping high electric insulation between the conductors of a printing wiring substrate in which the layer is used, and from the viewpoint of the resolution of the formed soldering mask pattern.

Next, examples of a method for using the photosensitive element of this invention are explained below.

The photosensitive element of this invention is easy to laminate on a substrate. That is to say, it is laminated, with heating under pressure, as such when it has no covering film, or after or while peeling off its covering film when it has a covering film. The lamination with heating under pressure can be carried out by means of a laminater which is well known to printed wiring board manufacturers. When the substrate has unevenness of 10 $\mu$m or more as in the case of a printed wiring board in which conductor-wiring lines have been formed, it is preferable to carry out the lamination under reduced pressure or in vacuo.

As an apparatus for such lamination, there is, for example, a laminating apparatus disclosed in Japanese Patent Appln Kokoku (Post-Exam Publn) No. 31,670/78 (U.S. Pat. No. 4,101,364) or Japanese Patent Appln Kokoku (Post-Exam Publn) No. 13,341/80 (U.S. Pat. No. 4,127,436).

The exposure and the development treatment after the lamination can be carried out by a conventional method. That is to say, when the support film is not pervious to actinic light, the support film is peeled off and thereafter the imagewise exposure is carried out through a negative mask by using a light source such as a high pressure mercury arc lamp, an ultra-high pressure mercury lamp, or the like. Heat treatment at 50° to 100° C. before and after the exposure is preferable for increasing adhesion between the substrate and the photosensitive resin layer.

As the developing solution, a solvent such as 1,1,1-trichloroethane or the like is used. It is preferable for safety to use a noncombustible solvent.

The imagewise protective coating film obtained in the manner described above is an anti-corrosive coating film for usual etching, metal plating, and the like, and it becomes a protective coating film having more excellent characteristics by heat treatment at 80° to 200° C.

and exposure to actinic light after the development. As to the order of the heat treatment and the exposure to actinic light after the development, either may be the first, and each of them may be carried out by dividing into several steps. The protective coating film obtained by heat treatment and exposure to actinic light after the development is sufficiently resistant to organic solvents such as trichlene, methyl ethyl ketone, isopropyl alcohol, toluene, and the like and is resistant also to an acidic aqueous solution and an aqueous alkali solution. Furthermore, it is excellent in heat resistance and resistance to thermal shock, and hence is suitable as a parmanent protective coating film such as a soldering mask and the like which is required to have reliability for a long time.

The protective coating film having as excellent characteristics as in the above can also be obtained by directly coating a substrate with a solution of the photosensitive resin composition of this invention by a dip-coating method, a flow-coating method, or the like, drying the solvent, imagewisely exposing the coating through a negative mask in the same manner as in the case of the above-mentioned photosensitive element, directly or after laminating a film pervious to actinic light on the coating, carrying out development, and then carrying out heat trreatment and exposure to actinic light.

Since a coating film formed by using the photosensitive resin composition or the photosensitive element of this invention has excellent chemical and physical characteristics as mentioned above, it is used also in printing materials, plastics reliefs, and the like.

Next, this invention is further explained below referring to Examples, in which all parts and percents are by weight unless otherwise provided.

EXAMPLE 1

(a) Synthesis of a urethane diacrylate compound

| A | Trimethylhexamethylene diisocyanate | 1,680 parts (16 equivalents) |
|---|---|---|
|   | Toluene (solvent) | 1,200 parts |
|   | Di-n-butyl tin dilaurate (catalyst) | 1 part |
| B | 1,6-Hexanediol | 472 parts (8 equivalents) |
| C | 2-Hydroxyethyl acrylate | 928 parts (8 equivalents) |
|   | Toluene (solvent) | 88 parts |
|   | Hydroquinone (thermopolymerization inhibitor) | 0.4 part |
| D | Methanol (stopping agent) | 32 parts |

The ingredients as mentioned above were placed in a reactor having a capacity of about 5 liters equipped with a thermometer, a stirrer, a condenser, a nitrogen-gas-introducing tube and a dropper which could be heated and cooled, and then ingredient A was heated to 60° C. with stirring. The ingredient B was uniformly added dropwise to the ingredient A in the reactor over a period of about 3 hours while maintaining the reaction temperature at 55° to 65° C. After the addition of the ingredient B, the resulting mixture was maintained at a temperature of 55° to 65° C. for about 2 hours, after which the ingredient C was uniformly added thereto dropwise at a temperature of about 55° to 65° C. over a period of about 3 hours. After the addition of the ingredient C, the reaction temperature was gradually raised to 80° C. over a period of about 5 hours. Thereafter, the temperature was lowered to 60° C., after which the ingredient D was added to the reaction mixture, and the thus obtained mixture was continuously stirred for about 1 hour to give a solution (I) of a urethane diacrylate compound which contained 70% of nonvolatile matters.

(b) Production of a photosensitive element

| | |
|---|---|
| The solution (I) of a urethane diacrylate compound obtained in the manner described above | 70 parts (49 parts in terms of non-volatile matters) |
| Methyl methacrylate-methacrylic acid-tetrahydrofurfuryl methacrylate (78/2/20; weight ratio) copolymer (having a molecular weight of about 150,000 and a glass transition temperature of about 95° C.) | 47 parts |
| Benzophenone | 2.7 parts |
| Michler's ketone | 0.3 parts |
| p-Methoxyphenol | 0.1 part |
| Crystal violet | 0.1 part |
| Methyl ethyl ketone | 80 parts |

A solution of a photosensitive resin composition was prepared by mixing the above-mentioned ingredients and then applied to a polyimide film of about 50 μm in thickness, and then dried at room temperature for 20 minutes, at 80° C. for 10 minutes and then at 105° C. for 5 minutes to obtain a photosensitive element in which the thickness of the layer of the photosensitive resin composition was about 60 μm.

(c) Formation of a soldering mask

Six test substrates having a copper pattern shown in FIG. 1 were obtained by imagewise etching of a laminate faced with glass epoxy copper in which the thickness of its substrate was 1.6 mm and the thickness of the copper foil was 1.8 μm. In FIG. 1, numeral 1 shows a copper pattern part; numeral 2 shows an exposed part of the substrate; and the unit of the figures is mm. The photosensitive element obtained in above (b) was laminated on each of the test substrates by using an A-500 type laminater manufactured by Akebono Industry Co., Ltd. After the lamination, the polyimide film as a support film was peeled off, and the test substrates were exposed at 900 mJ/cm² by means of a Phenix 3000 type exposing machine manufactured by ORC Factory Co., Ltd. by using a negative mask for test shown in FIG. 2. In FIG. 2, numeral 3 shows an opaque part of the negative mask; numeral 4 shows a transparent part of the negative mask; and the unit of the figures is mm. After the exposure, the test substrates were allowed to stand for 30 minutes, and then subjected to spray development at 20° C. for 90 seconds by using 1,1,1-trichloroethane. After the development, they were heated and dried at 80° C. for 10 minutes and then irradiated at 2.5 J/cm² by using an ultraviolet light irradiating equipment manufactured by Toshiba Denzai Co., Ltd.

Thereafter, it was heat-treated at 150° C. for 30 minutes.

Four of the six test substrates on which a protective coating film was thus formed were immersed in isopropanol, toluene, trichlene, or a 10% aqueous hydrochloric acid solution, all at 25° C., respectively, for 10 minutes to find that the formed protective coating film underwent no change.

When another one of the test substrates was immersed in a soldering bath at 255° C. to 265° C. for 30 seconds, its protective coating film was so stable that it did neither crack nor peel off from the substrate, and therefore it was found to be sufficiently usable as a soldering mask.

The remaining one test substitute was subjected to soldering treatment in a soldering bath at 255° to 265° C. for 3 seconds by using a rosin series flux A-226 (manufactured by Tamura Kaken Co., Ltd.), and then subjected to the thermal shock test of 50 cycles under MIL-STD-202E method 107D condidtion B (−65° C. for 30 minutes ⇌ ordinary temperature for 5 minutes or less ⇌ 125° C. for 30 minutes) to find that its protective coating film did not crack and was greatly excellent in reliability for a long time.

EXAMPLE 2

(a) Synthesis of a urethane diacrylate compound

| A | Trimethylhexamethylene diisocyanate | 1,680 parts (16 equivalents) |
|---|---|---|
|   | Toluene | 800 parts |
|   | Di-n-butyl tin dilaurate (catalyst) | 1 part |
| B | 1,4-Cyclohexane dimethanol | 360 parts (5 equivalents) |
|   | 2-Hydroxyethyl acrylate | 348 parts (3 equivalents) |
|   | Methyl ethyl ketone (solvent) | 520 parts |
| C | 2-Hydroxyethyl acrylate | 928 parts (8 equivalents) |
|   | Toluene (solvent) | 80 parts |
|   | p-Methoxyphenol (thermopolymerization inhibitor) | 0.3 part |
| D | Ethanol (stopping agent) | 23 parts |

A solution of a urethane acrylate compound was obtained according to the above recipe in the same manner as in Example 1-(a). Thereafter, it was dried under reduced pressure to obtain a viscous urethane diacrylate compound (II).

(b) Production of a photosensitive element

| The urethane diacrylate compound (II) obtained by the above-mentioned process | 40 parts |
|---|---|
| Methyl methacrylate-methyl acrylate-2-hydroxyethyl methacrylate-acrylonitrile (80/10/5/5 weight ratio) copolymer (having a molecular weight of about 100,000 and a glass transition temperature of about 90° C.) | 57 parts |
| Benzophenone | 2.7 parts |
| Michler's ketone | 0.3 part |
| p-Methoxyphenol | 0.1 part |
| Victoria pure blue | 0.05 part |
| Methyl ethyl ketone | 80 parts |
| Toluene | 40 parts |

A solution 10 of a photosensitive resin composition prepared from the above recipe was uniformly applied to a polyethylene terephthalate film 16 of 25 μm in thickness by using an apparatus shown in FIG. 3, and then dried in a hot-air convection dryer 11 at 80° to 100° C. for about 10 minutes. The thickness after drying of the layer of the photosensitive resin composition was about 100 μm. A polyethylene film 17 of about 25 μm in thickness was stuck as a covering film on the layer of the photosensitive resin composition as shown in FIG. 3.

In FIG. 3, numeral 5 shows a polyethylene terephthalate film delivering roll, numerals 6, 7 and 8 rolls, numeral 9 a knife, numeral 12 a polyethylene film delivering roll, numerals 13 and 14 rolls and numeral 15 a photosensitive element winding roll.

(c) Formation of a soldering mask

The photosensitive element obtained in the above was laminated with heating under pressure on printed wiring boards for test (having a glass epoxy substrate and a thickness of 1.6 mm) in which a copper pattern (copper thickness: about 70 μm) shown in FIG. 1 had been formed, by using a vacuum laminater manufactured by Hitachi Chemical Co., Ltd. (degree of vacuum: 30 mmHg, lamination temperature: 100° C., lamination speed: 2 m/min.). After the lamination, the printed wiring boards were heated at 60° C. for 5 minutes, allowed to stand at room temperature for 3 hours, and then exposed at 150 mJ/cm$^2$ through a negative mask for test shown in FIG. 2, as in Example 1-c).

After the exposure, the boards were heated at 80° C. for 5 minutes and then allowed to stand at room temperature for 20 minutes, after which the support film was peeled off, and the boards were subjected to spray development at 20° C. for 150 seconds by using 1,1,1-trichloroethane.

After the development, the boards were heated and dried at 80° C. for 10 minutes, irradiated with ultraviolet light at 3.0 J/cm$^2$, and then heat-treated at 130° C. for 2 hours.

The test substrates on which a protective coating film had been formed in the manner described above were subjected to an immersion test in isopropanol, toluene, trichlene or a 10% aqueous hydrochloric acid solution all at 25° C., respectively, for 10 minutes in the same manner as in Example 1-(c) to find that the formed protective coating film underwent no change.

When an immersion test was carried out in a soldering bath at 255° to 265° C. for 30 seconds, the protective coating film showed no defect and was excellent in heat resistance. Further, in the thermal shock test of 50 cycles under MIL-STD-202E method 107D condition B after the same soldering treatment as in Example 1-(c), the formed coating film did not crack.

EXAMPLE 3

| The urethane diacrylate compound (II) obtained in Example 2-a) | 60 parts |
|---|---|
| Methyl methacrylate-methacrylic acid (98/2 weight ratio) copolymer (having a molecular weight of about 100,000 and a glass transition temperature of about 105° C.) | 37 parts |
| Benzophenone | 2.7 parts |
| Michler's ketone | 0.3 part |
| p-Methoxyphenol | 0.1 part |
| Victoria pure blue | 0.02 part |
| Methyl ethyl ketone | 60 parts |
| Toluene | 70 parts |

By the use of a solution of a photosensitive resin composition prepared from the above recipe, a photosensitive element in which the thickness of a layer of the photosensitive resin composition was about 80 μm was obtained by using an apparatus shown in FIG. 3, as in Example 2-(b). The photosensitive element was laminated under reduced pressure in the same manner as in Example 2-(c) on printed wiring boards for test on which a copper pattern (copper thickness: about 50 μm) shown in FIG. 1 had been formed. Further, the same treatment as in Example 2-(c) was carried out to form an imagewise protective coating film on said test substrates. The formed protective coating film showed no defect in the immersion test in isopropanol, toluene, trichlene, methyl ethyl ketone, a 10% aqueous hydrochloric acid solution or a 10% aqueous NaOH solution all at 25° C., respectively, for 10 minutes, and was so excellent in heat resistance that it did neither crack nor peel off from the substrate in the immersion test for 30 seconds in a soldering bath at 255° to 265° C. Further, when the test substrate was subjected to the same soldering treatment as in Example 1-(c) and then subjected to the thermal shock test of 50 cycles under MIL-STD-202E method 107D condition B, the protective coating film did not crack.

COMPARATIVE EXAMPLE 1

The same procedures as in Example 2-(b) and Example 2-(c) were carried out except that trimethylolpropane triacrylate was substituted for the urethane diacrylate compound (II) in Example 2-(b). The finally obtained protective coating film partly peeled off from the substrate in the immersion test in a soldering bath at 255° to 265° C. for 30 seconds. After the same soldering treatment as in Example 1-(c), the protective coating film cracked within 5 cycles in the thermal shock test under MIL-STD-202E method 107D condition B.

COMPARATIVE EXAMPLE 2

The same procedure as in Example 3 was carried out except that 20 parts of pentaerythritol triacrylate and 40 parts of a di-(3-acryloxy-2-hydroxypropyl)ester of bisphenol A were substituted for 60 parts of the urethane diacrylate compound (II) in Example 3. After the same soldering treatment as in Example 1-(c), the finally obtained protective coating film cracked within 5 cycles in the thermal shock test under MIL-STD-202E method 107D condition B. A part of the protective coating film was about to peel off from the substrate in the immersion test for 10 minutes in a 10% aqueous hydrochloric acid solution.

COMPARATIVE EXAMPLE 3

| | |
|---|---|
| Trimethylolpropane triacrylate | 30 parts |
| Polypropylene glycol (having an average molecular weight of 1,000) diacrylate | 10 parts |
| Methyl methacrylate-methacrylic acid-tetrahydrofurfuryl methacrylate (78/2/20 weight ratio) copolymer (having a molecular weight of about 150,000 and a glass transition temperature of about 95° C.) | 50 parts |
| Benzophenone | 2.7 parts |
| Michler's ketone | 0.3 part |
| p-Methoxyphenol | 0.5 part |
| Methyl ethyl ketone | 200 parts |

The same procedure as in Example 3 was carried out except that a solution of a photosensitive resin composition prepared from the above recipe was used. The finally obtained protective coating film was excellent in solvent resistance and heat resistance, but cracked within 10 cycles in the thermal shock test under MIL-STD-202E method 107D condition B after the same soldering treatment as in Example 1-(c).

EXAMPLE 4

(a) Synthesis of a urethane diacrylate compound

| | | |
|---|---|---|
| A | Trimethylhexamethylene diisocyanate | 1,680 parts (16 equivalents) |
| | Toluene (solvent) | 1,200 parts |
| | Di-n-butyl tin dilaurate (catalyst) | 1 part |
| B | Triethylene glycol | 600 parts (8 equivalents) |
| C | 2-Hydroxypropyl acrylate | 1,040 parts (8 equivalents) |
| | Toluene (solvent) | 190 parts |
| | Hydroquinone (thermopolymerization inhibitor) | 0.4 part |
| D | Methanol (stopping agent) | 32 parts |

A solution of a urethane diacrylate compound was obtained according to the above recipe in the same manner as in Example 1-(a). Thereafter, the solution was dried under reduced pressure to obtain a viscous urethane diacrylate compound (III).

(b) Production of a photosensitive element and formation of a soldering mask

| | |
|---|---|
| The urethane diacrylate compound (III) obtained in the manner described above | 60 parts |
| Methyl methacrylate-methacrylic acid-tribromophenyl acrylate (38/2/60 weight ratio) copolymer (having a molecular weight of about 120,000, a glass transition temperature of about 120° C. and a bromine content of 37% by weight) | 37 parts |
| Benzophenone | 2.7 parts |
| 4,4'-Bis(diethylamino)-benzophenone | 0.3 part |
| 2,2'-methylenebis(4-ethyl-6-t-butylphenol) | 0.3 part |
| Victoria pure blue | 0.02 part |
| Methyl ethyl ketone | 100 parts |
| Toluene | 50 parts |

The same procedures as in Example 2-(b) and Example 2-(c) were followed, with the exception that a solution of a photosensitive resin composition prepared from the above recipe was used. The finally obtained protective coating film showed no defect in the immersion test for 10 minutes in a 10% aqueous hydrochloric acid solution, and underwent no change such as peeling-off and cracking when immersed in a soldering bath at 255° to 265° C. for 30 seconds. After the same soldering treatment as in Example 1-(c), the protective coating film did not crack in the thermal shock test of 50 cycles under MIL-STD-202E method 107D condition B. A protective coating film was formed by the same procedure as in the above on the whole surface of a substrate of 0.8 mm in thickness of a printing wiring substrate MCL-E-68 (UL flame-retardancy grade 94V-0) manufactured by Hitachi Chemical Co., Ltd. This protective coating film satisfied the standards of 94V-1 of UL.

EXAMPLE 5

(a) Synthesis of a urethane diacrylate compound

| | | |
|---|---|---|
| A | Trimethylhexamethylene diisocyanate | 1,680 parts (16 equivalents) |

|   | Toluene (solvent) | 1,000 parts |
|---|---|---|
|   | Di-n-butyl tin dilaurate (catalyst) | 1 part |
| B | Ethylene glycol | 310 parts (10 equivalents) |
| C | 2-Hydroxyethyl acrylate | 696 parts (6 equivalents) |
|   | Toluene (solvent) | 150 parts |
|   | Hydroquinone (thermopolymerization inhibitor) | 0.3 part |
| D | Methanol (stopping agent) | 32 parts |

A solution of a urethane diacrylate compound was obtained according to the above recipe in the same manner as in Example 1-(a). Thereafter, it was dried under reduced pressure to obtain a viscous urethane diacrylate compound (IV).

(b) Production of a photosensitive element and formation of a soldering mask

| The urethane diacrylate compound (IV) obtained in the manner described above | 50 parts |
|---|---|
| Methyl methacrylate-methyl acrylate-acrylic acid-tetrahydrofurfuryl methacrylate-tribromophenyl acrylate (40/23/2/10/25 weight ratio) copolymer (having a molecular weight of about 80,000, a glass transition temperature of about 75° C. and a bromine content of 15% by weight) | 47 parts |
| Benzophenone | 2.7 parts |
| Michler's ketone | 0.3 part |
| 2,2'-Methylenebis(4-methyl-6-t-butylphenol) | 0.5 part |
| Victoria pure blue | 0.02 part |
| Methyl ethyl ketone | 100 parts |
| Toluene | 50 parts |

The same procedures as in Example 2-(b) and Example 2-(c) were followed, with the exception that a solution of a photosensitive resin composition prepared from the above recipe was used. The finally obtained protective coating film showed no defect in the immersion test for 10 minutes in isopropanol, toluene, trichlene, or a 10% aqueous hydrochloric acid solution, and underwent no change such as peeling-off and cracking when immersed in a soldering bath at 255° to 265° C. for 30 seconds. After the same soldering treatment as in Example 1-(c), the protective coating film did not crack in the thermal shock test of 50 cycles under MIL-STD-202E method 107D condition B. A protective coating film was formed by the same procedure as in the above on the whole surface of a substrate of 1.6 mm in thickness of a printed wiring board MCL-E-68 manufactured by Hitachi Chemical Co., Ltd. This protective coating film satisfied the standards of 94V-1 of UL.

EXAMPLE 6

The same procedure as in Example 5-(b) was followed, with the exception that 1 part of antimony trioxide was additionally incorporated into the solution of the photosensitive resin composition in Example 5-(b). The finally obtained protective coating film was as good as in Example 5-(b) in solvent resistance, heat resistance and resistance to thermal shock. A protective coating film was formed by the same procedure as in the above on the whole surface of a substrate of 1.6 mm in thickness of a printed wiring substrate MCL-E-68 manufactured by Hitachi Chemical Co., Ltd. This protective coating film satisfied the standards of 94V-0 of UL.

EXAMPLE 7

(a) Synthesis of a urethane dimethacrylate compound

| A | Trimethylhexamethylene diisocyanate | 1,680 parts (16 equivalents) |
|---|---|---|
|   | Toluene (solvent) | 1,000 parts |
|   | Di-n-butyl tin dilaurate (catalyst) | 1 part |
| B | 1,4-Butanediol | 360 parts (8 equivalents) |
| C | 2-Hydroxyethyl methacrylate | 1,040 parts (8 equivalents) |
|   | Toluene (solvent) | 280 parts |
|   | Hydroquinone (thermopolymerization inhibitor) | 0.3 part |
| D | Methanol (stopping agent) | 32 parts |

A solution of a urethane dimethacrylate compound was obtained according to the above recipe in the same manner as in Example 1-(a). Thereafter, it was dried under reduced pressure to obtain a viscous urethane dimethacrylate compound (V).

(b) Production of a photosensitive element and formation of a soldering mask

| The urethane dimethacrylate compound (V) obtained in the manner described above | 40 parts |
|---|---|
| Methyl methacrylate-methacrylic acid-tetrafurfuryl methacrylate-acrylonitrile-tribromophenyl acrylate (43/2/20/5/30 weight ratio) copolymer (having a molecular weight of about 150,000, a glass transition temperature of about 100° C. and a bromine content of 18% by weight) | 57 parts |
| Benzophenone | 2.7 parts |
| Michler's ketone | 0.3 part |
| p-Methoxyphenol | 0.05 part |
| Victoria pure blue | 0.05 part |
| Toluene | 150 parts |

The same procedures as in Example 2-(b) and Example 2-(c) were followed, with the exception that a solution of a photosensitive resin composition prepared from the above recipe was used. The finally obtained protective coating film showed no defect in the immersion test for 10 minutes in isopropanol, toluene, trichlene or a 10% aqueous hydrochloric acid solution, and underwent no change such as peeling-off and cracking when immersed in a soldering bath at 255° to 265° C. for 30 seconds. After the same soldering treatment as in Example 1-(c), it did not crack in the thermal shock test of 50 cycles under MIL-STD-202E method 107D condition B. A protective coating film was formed by the same procedure as above on the whole surface of a substrate of 1.6 mm in thickness of a printed wiring substrate MCL-E-68 manufactured by Hitachi Chemical Co., Ltd. This protective coating film satisfied the standards of 94V-1 of UL.

EXAMPLE 8

(a) Synthesis of a urethane diacrylate compound

| A | Trimethylhexamethylene diisocyanate | 1,680 parts (16 equivalents) |
| --- | --- | --- |
| | Toluene (solvent) | 1,000 parts |
| | Di-n-butyl tin dilaurate (catalyst) | 1 part |
| B | 1,4-Cyclohexane-dimethanol | 216 parts (3 equivalents) |
| | Tetraethylene glycol | 291 parts (3 equivalents) |
| | Methyl ethyl ketone (solvent) | 200 parts |
| C | 2-Hydroxyethyl acrylate | 1,160 parts (10 equivalents) |
| | Toluene (solvent) | 200 parts |
| | p-Methoxyphenol (thermopolymerization inhibitor) | 0.2 part |
| D | Methanol | 32 parts |

A solution of a urethane diacrylate compound was obtained according to the above recipe in the same manner as in Example 1-(a). Thereafter, it was dried under reduced pressure to obtain a viscous urethane diacrylate compound (VI).

(b) Production of a photosensitive element

| The urethane diacrylate compound (VI) obtained in the manner described above | 47 parts |
| --- | --- |
| Methyl methacrylate-methyl acrylate-acrylic acid-tetra-hydrofurfuryl methacrylate-2-hydroxyethyl methacrylate-tribromophenyl acrylate (43/10/2/5/5/35 weight ratio) copolymer (having a molecular weight of about 150,000, a glass transition temperature of about 90° C. and a bromine content of 22% by weight) | 50 parts |
| Benzophenone | 2.7 parts |
| Michler's ketone | 0.3 part |
| p-Methoxyphenol | 0.05 part |
| Victoria pure blue | 0.02 part |
| KAYAMER PA-2 (manufactured by Nihon Kayaku Co., Ltd.: divalent acrylate containing a phosphoric acid group) | 0.1 part |
| Methyl ethyl ketone | 50 parts |
| Toluene | 100 parts |

By the use of a solution of a photosensitive resin composition prepared from the above recipe, a photosensitive element in which the thickness of a layer of the photosensitive resin composition was about 50 μm was obtained by using an apparatus shown in FIG. 3, as in Example 2-(b).

(c) Formation of a soldering mask

The photosensitive element obtained in the above was laminated under reduced pressure in the same manner as in Example 2-(c) on a printed wiring boards for test on which a copper pattern (copper thickness: about 18 μm) shown in FIG. 1 had been formed. After the lamination, the printed wiring boards were allowed to stand at room temperature for 3 hours, and then exposed at 200 mJ/cm² through a negative mask for test shown in FIG. 2, as in Example 1-(c). After the exposure, the boards were heated at 80° C. for 5 minutes and then allowed to cool at room temperature for 20 minutes, after which the support film was peeled off, and the boards were subjected to spray development at 20° C. for 70 seconds by using 1,1,1-trichloroethane. After the development, the boards were heated and dried at 80° C. for 30 minutes, and further heated at 120° C. for 30 minutes and then at 150° C. for 30 minutes. The heated boards were allowed to cool at room temperature for 10 minutes, irradiated with ultraviolet light at 10 J/cm², and then heat-treated at 130° C. for 2 hours.

The test substrates on which a protective coating film had been formed in the manner described above were subjected to the immersion test for 10 minutes in isopropanol, toluene, trichlene or a 10% aqueous hydrochloric acid solution all at 25° C. in the same manner as in Example 1-(c), to find that the protective coating film showed no defect. The protective coating film did not peel off in the immersion test for 30 minutes in a soldering bath at 255° to 265° C. and hence was good in heat resistance. After the same soldering treatment as in Example 1-(c), the film did not crack in the thermal shock test of 50 cycles under MIL-STD-202E method 107D condition B. The protective coating film was so excellent in adhesion that it did not peel off in a cross-cutting test. A protective coating film was formed by the same procedure as in the above on the whole surface of a substrate of 0.8 mm in thickness of a printed wiring substrate MCL-E-68 manufactured by Hitachi Chemical Co., Ltd. This protective coating film satisfied the standards of 94V-1 of UL.

COMPARATIVE EXAMPLE 4

A urethane diacrylate compound was synthesized in the same manner as in Example 1-(a), except that 1,344 parts (16 equivalents) of hexamethylene diisocyanate was substituted for 1,680 parts (16 equivalents) of trimethylhexamethylene diisocyanate in Example 1-(a).

The produced urethane diacrylate compound (VII) was insoluble in toluene, the reaction solvent, and separated as wax just as it was produced. The obtained urethane diacrylate compound (VII) was slightly soluble in methyl ethyl ketone and 1,1,1-trichloroethane, and soluble in acetone and chloroform.

| The obtained urethane diacrylate compound (VII) | 50 parts |
| --- | --- |
| The copolymer used in Example 1-b) | 47 parts |
| Benzophenone | 2.7 parts |
| Michler's ketone | 0.3 part |
| p-Methoxyphenol | 0.05 part |
| Victoria pure blue | 0.02 part |
| Acetone | 50 parts |
| Chloroform | 100 parts |

A solution of a photosensitive resin composition prepared from the above recipe was applied to a polyethylene terephthalate film by using an apparatus shown in FIG. 3, as in Example 2-(b), and then dried in hot air to find that the urethane diacrylate comound (VII) and the copolymer separated from each other just as the solvent was dried, so that no desirable photosensitive element could be obtained. When any of the copolymers used in Examples 2 to 8 was used, the miscibility was as low as in the above, and no desirable photosensitive element could be obtained.

EXAMPLE 9

(a) Synthesis of a urethane diacrylate compound

| A | Isophorone diisocyanate | 1,776 parts (16 equivalents) |
| --- | --- | --- |
| | Toluene (solvent) | 1,200 parts |
| | Di-n-butyl tin | 1 part |

| | | |
|---|---|---|
| | dilaurate (catalyst) | |
| B | 1,6-Hexanediol | 472 parts (8 equivalents) |
| C | 2-Hydroxyethyl acrylate | 928 parts (8 equivalents) |
| | Toluene (solvent) | 129 parts |
| | Hydroquinone (thermopolymerization inhibitor) | 0.4 part |
| D | Methanol (stopping agent) | 32 parts |

The ingredient A was placed in a reactor having a capacity of about 5 liters equipped with a thermometer, a stirrer, a condenser, a nitrogen-gas-introducing tube and a dropper which could be heated and cooled, and than A was heated to 60° C. with stirring. B was uniformly added dropwise to A in the reactor over a period of about 3 hours while maintaining the reaction temperature at 55° to 65° C. After the addition of B, the resulting mixture was maintained at a temperature of 55° to 65° C. for about 2 hours, after which C was uniformly added thereto dropwise at a temperature of about 55° to 65° C. over a period of about 3 hours. After the addition of C, the reaction temperature was gradually raised to 80° C. over a period of about 5 hours.

Thereafter, the temperature was lowered to 60° C., after which D was added to the reaction mixture, and the thus obtained mixture was continuously stirred for about 1 hour. A solution (VIII) of a urethane diacrylate compound which contained 70% of nonvolatile matters was thus obtained.

(b) Production of a photosensitive element

| | |
|---|---|
| The solution (VIII) of a urethane diacrylate compound obtained in the manner described above | 70 parts (49 parts in terms of nonvolatile matters) |
| Methyl methacrylate-methacrylic acid-tetrahydrofurfuryl methacrylate (78/2/20: weight ratio) copolymer (having a molecular weight of about 150,000 and a glass transition temperature of about 95° C.) | 47 parts |
| 2-Ethylanthraquinone | 4 parts |
| p-Methoxyphenol | 0.1 part |
| Crystal violet | 0.1 part |
| Methyl ethyl ketone | 80 parts |

A solution of a photosensitive resin composition was prepared according to the above recipe, applied to a polyimide film of about 50 μm in thickness, and dried at room temperature for 20 minutes, at 80° C. for 10 minutes and then at 105° C. for 5 minutes to obtain a photosensitive element in which the thickness of a layer of the photosensitive resin composition was about 60 μm.

(c) Formation of a soldering mask

Six test substrates having a copper pattern shown in FIG. 1 were obtained by imagewisely etching a laminate faced with glass epoxy copper in which the thickness of its substrate was 1.6 mm and the thickness of the copper foil was 18 μm. In FIG. 1, 1 shows a copper pattern part and 2 shows an exposed part of the substrate, and the unit of the figures is mm.

The photosensitive element obtained in above (b) was laminated on each of the test substrates by using an A-500 type laminater manufactured by Akebono Industry Co., Ltd. After the lamination, the polyimide film as a support film was peeled off, and the test substrates were exposed at 900 mJ/cm² by means of a Phenix 3000 type exposing machine manufactured by ORC Factory Co., Ltd. by using a negative mask for test shown in FIG. 2. In FIGS. 2, 3 shows an opaque part of the negative mask and 4 shows a transparent part of the negative mask, and the unit of the figures is mm. After the exposure, the test substrates were allowed to stand for 30 minutes, and then subjected to spray development at 20° C. for 90 seconds by using 1,1,1-trichloroethane.

After the development, the test substrates were heated and dried at 80° C. for 10 minutes, and then irradiated at 2.5 J/cm² by using an ultraviolet light irradiating equipment manufactured by Toshiba Denzai Co., Ltd.

Thereafter, they were heat-treated at 150° C. for 30 minutes. Four of the six test substrates on which a protective coating film was thus formed were immersed in isopropanol, toluene, trichlene, or a 10% aqueous hydrochloric acid solution all at 25° C., respectively, for 10 minutes to find that the formed protective coating film underwent no change.

When another one of the test substrates was immersed in a soldering bath at 255° to 265° C. for 30 seconds, its protective coating film was so stable that it did neither crack nor peel off from the substrate, and therefore it was found to be sufficiently usable as a soldering mask.

Further, the remaining one test substrate was subjected to soldering treatment in a soldering bath at 255° to 265° C. for 3 seconds by using a rosin series flux A-226 (manufactured by Tamura Kaken Co., Ltd.), and then subjected to the thermal shock test of 20 cycles under MIL-STD-202E method 107D condition B (−65° C. for 30 minutes⇌ordinary temperature for 5 minutes or less⇌125° C. for 30 minutes). As a result, its protective coating film did not crack and was found to be greatly excellent in long-term reliability.

EXAMPLE 10

(a) Synthesis of a urethane diacrylate compound

| | | |
|---|---|---|
| A | Isophorone diisocyanate | 1,776 parts (16 equivalents) |
| | Toluene (solvent) | 800 parts |
| | Di-n-butyl tin dilaurate (catalyst) | 1 part |
| B | 1,4-Cyclohexane dimethanol | 360 parts (5 equivalents) |
| | 2-Hydroxyethyl acrylate | 348 parts (3 equivalents) |
| | Methyl ethyl ketone (solvent) | 520 parts |
| C | 2-Hydroxyethyl acrylate | 928 parts (8 equivalents) |
| | Toluene (solvent) | 80 parts |
| | p-Methoxyphenol (thermopolymerization inhibitor) | 0.3 part |
| D | Ethanol (stopping agent) | 23 parts |

A solution of a urethane diacrylate compound was obtained according to the above recipe in the same manner as in Example 9-(a). Thereafter, it was dried under reduced pressure to obtain a viscous urethane diacrylate compound (IX).

(b) Production of a photosensitive element

| | |
|---|---|
| The urethane diacrylate | 40 parts |

| -continued | | |
|---|---|---|
| compound (IX) obtained in the manner described above | | |
| Methyl methacrylate-methyl acrylate-2-hydroxyethyl methacrylate-acrylonitrile (80/10/5/5 weight ratio) copolymer (having a molecular weight of about 100,000 and a glass transition temperature of about 90° C.) | 57 | parts |
| Benzophenone | 2.7 | parts |
| Michler's ketone | 0.3 | part |
| p-Methoxyphenol | 0.1 | part |
| Victoria pure blue | 0.05 | part |
| Methyl ethyl ketone | 80 | parts |
| Toluene | 40 | parts |

A solution 10 of a photosensitive resin composition prepared from the above recipe was uniformly applied to a polyethylene terephthalate film 16 of 25 μm in thickness by using an apparatus shown in FIG. 3, and then dried in a hot-air convention dryer 11 at 80° to 100° C. for about 10 minutes. The thickness after drying of the layer of the photosensitive resin composition was about 100 μm. A polyethylene film 17 of about 25 μm in thickness was stuck, as a covering film, on the layer of the photosensitive resin composition, as shown in FIG. 3. In FIG. 3, 5 shows a polyethylene terephthalate film delivering roll, 6, 7 and 8 rolls, 9 a knife, 12 a polyethylene film delivering roll, 13 and 14 rolls and 15 a photosensitive element wiring roll.

(c) Formation of a soldering mask

The photosensitive element obtained in the above was laminated with heating under pressure on a printed wiring board for test (having a glass epoxy substrate and a thickness of 1.6 mm) in which a copper pattern (copper thickness: about 70 μm) shown in FIG. 1 had been formed, by using a vacuum laminater manufactured by Hitachi Chemical Industry Co., Ltd. (degree of vacuum: 30 mmHg, lamination temperature: 100° C., lamination speed: 2 m/min.). After the lamination, the printed wiring boards were heated at 60° C. for 5 minutes, allowed to stand at room temperature for 3 hours, and then exposed at 150 mJ/cm$^2$ through a negative mask for test shown in FIG. 2, as in Example 9-(c).

After the exposure, the boards were heated at 80° C. for 5 minutes and then allowed to stand at room temperature for 20 minutes, after which the support film was peeled off, and the boards were subjected to spray development at 20° C. for 150 seconds by using 1,1,1-trichloroethane.

After the development, the boards were heated and dried at 80° C. for 10 minutes, irradiated with ultraviolet light at 3.0 J/cm$^2$, and then heat-treated at 130° C. for 2 hours.

The test substrates on which a protecting coating film had been formed in the manner described above were subjected to the immersion test for 10 minutes in isopropanol, toluene, trichlene, or a 10% aqueous hydrochloric acid solution all at 25° C. in the same manner as in Example 9-(c) to find that the formed protective coating film underwent no change.

When the immersion test was carried out in a soldering bath at 255° to 265° C. for 30 seconds, the protective coating film showed no defect and hence was excellent in heat resistance. After the same soldering treatment as in Example 9-(c), the formed coating film did not crack in the thermal shock test of 20 cycles under MIL-STD-202E method 107D condition B.

EXAMPLE 11

| The urethane diacrylate compound (IX) obtained in Example 10-a) | 60 | parts |
|---|---|---|
| Methyl methacrylate-methacrylic acid (98/2 weight ratio) copolymer (having a molecular weight of about 100,000 and a glass transition temperature of about 105° C.) | 37 | parts |
| Benzophenone | 2.7 | parts |
| Michler's ketone | 0.3 | part |
| p-Methoxyphenol | 0.1 | part |
| Victoria pure blue | 0.02 | part |
| Methyl ethyl ketone | 60 | parts |
| Toluene | 70 | parts |

By the use of a solution of a photosensitive resin composition prepared from the above recipe, a photosensitive element in which the thickness of a layer of the photosensitive resin composition was about 80 μm was obtained by using an apparatus shown in FIG. 3, as in Example 10-(b). The photosensitive element was laminated under reduced pressure in the same manner as in Example 10-(c) on printed wiring boards for test on which a copper pattern (copper thickness: about 50 μm) shown in FIG. 1 had been formed. Further, the same treatment as in Example 10-(c) was carried out to form an imagewise protective coating film on said test substrates. The formed protective coating film showed no defect in the immersion test for 10 minutes in isopropanol, toluene, trichlene, methyl ethyl ketone, a 10% aqueous hydrochloric acid solution or a 10% aqueous NaOH solution all at 25° C., and was so excellent in heat resistance that it did neither crack nor peel off from the substrate in the immersion test for 30 seconds in a soldering bath at 255° to 265° C. after the same soldering treatment as in Example 9-(c). After the same soldering treatment as in Example 9-(c), the protective coating film did not crack in the thermal shock test of 20 cycles under MIL-STD-202E method 107D condition B.

COMPARATIVE EXAMPLE 5

The same procedures as in Example 10-(b) and Example 10-(c) were followed, with the exception that trimethylolpropane triacrylate was substituted for the urethane diacrylate compound (IX) in Example 10-(b). The finally obtained protective coating film partly peeled off from the substrate in the immersion test for 30 seconds in a soldering bath at 255° to 265° C. After the same soldering treatment as in Example 9-(c), the protective coating film cracked within 5 cycles in the thermal shock test under MIL-STD-202E method 107D condition B.

COMPARATIVE EXAMPLE 6

The same procedure as in Example 11 was followed, with the exception that 20 parts of pentaerythritol triacrylate and 40 parts of di-(3-acryloxy-2-hydroxypropyl) ester of bisphenol A were substituted for 60 parts of the urethane diacrylate compound (IX) in Example 11. The finally obtained protective coating film cracked in the thermal shock test of 5 cycles under MIL-STD-202E method 107D condition B after the same soldering treatment as in Example 9-(c). A part of the protective coating film was about to peel off from the substrate in the immersion test for 10 minutes in a 10% aqueous hydrochloric acid solution.

COMPARATIVE EXAMPLE 7

| Trimethylolpropane triacrylate | 30 parts |
|---|---|
| Polypropylene glycol (having an average molecular weight of 1,000) diacrylate | 10 parts |
| Methyl methacrylate-methacrylic acid-tetrahydrofurfuryl methacrylate (78/2/20 weight ratio) copolymer (having a molecular weight of about 150,000 and a glass transition temperature of about 95° C.) | 50 parts |
| Benzophenone | 2.7 parts |
| Michler's ketone | 0.3 part |
| p-Methoxyphenol | 0.5 part |
| Methyl ethyl ketone | 200 parts |

The same procedure as in Example 11 was followed, with the exception that a solution of a photosensitive resin composition prepared from the above recipe was used. The finally obtained protective coating film was excellent in solvent resistance and heat resistance, but cracked within 10 cycles in the thermal shock test under MIL-STD-202E method 107D condition B after the same soldering treatment as in Example 9-(c).

EXAMPLE 12

(a) Synthesis of a urethane diacrylate compound

| A | Isophorone diisocyanate | 1,776 parts (16 equivalents) |
|---|---|---|
| | Toluene (solvent) | 1,200 parts |
| | Di-n-butyl tin dilaurate (catalyst) | 1 part |
| B | Tetraethylene glycol | 776 parts (8 equivalents) |
| C | 2-Hydroxypropyl acrylate | 1,040 parts (8 equivalents) |
| | Toluene (solvent) | 300 parts |
| | Hydroquinone (thermopolymerization inhibitor) | 0.4 part |
| D | Methanol (stopping agent) | 32 parts |

A solution of a urethane diacrylate compound was obtained according to the above recipe in the same manner as in Example 9-(a). Thereafter, it was dried under reduced pressure to obtain a viscous urethane diacrylate compound (X).

(b) Production of a photosensitive element and formation of a soldering mask

| The urethane diacrylate compound (X) obtained in the manner described above | 60 parts |
|---|---|
| Methyl methacrylate-methacrylic acid-tribromophenyl acrylate (38/2/60 weight ratio) copolymer (having a molecular weight of about 120,000, a glass transition temperature of about 120° C. and a bromine content of 37% by weight) | 37 parts |
| Benzophenone | 2.7 parts |
| 4,4'-Bis(diethylamino)benzophenone | 0.3 part |
| 2,2'-Methylenebis(4-ethyl-6-t-butylphenol) | 0.3 part |
| Victoria pure blue | 0.02 part |
| Methyl ethyl ketone | 100 parts |
| Toluene | 50 parts |

The same procedures as in Example 10-(b) and Example 10-(c) were followed, with the exception that a solution of a photosensitive resin composition prepared from the above recipe was used. The finally obtained protective coating film showed no defect in the immersion test for 10 minutes in isopropanol, toluene, trichlene or a 10% aqueous hydrochloric acid solution all at 25° C., and underwent no change such as peeling-off and cracking when immersed in a soldering bath at 255° to 265° C. for 30 seconds. It did not crack also in the thermal shock test of 20 cycles under MIL-STD-202E method 107D condition B after the same soldering treatment as in Example 9-(c). A protective coating film was formed of the same procedure as in the above on the whole surface of a substrate of 0.8 mm in thickness of a printed wiring substrate MCL-E-68 (UL flame-retardancy grade 94V-0) manufactured by Hitachi Chemical Co., Ltd. This coating film satisfied the standards of 94V-1 of UL.

EXAMPLE 13

(a) Synthesis of a urethane diacrylate compound

| A | Isophorone diisocyanate | 1,776 parts (16 equivalents) |
|---|---|---|
| | Toluene (solvent) | 1,000 parts |
| | Di-n-butyl tin dilaurate (catalyst) | 1 part |
| B | Ethylene glycol | 310 parts (10 equivalents) |
| C | 2-Hydroxyethyl acrylate | 696 parts (6 equivalents) |
| | Toluene (solvent) | 150 parts |
| | Hydroquinone (thermopolymerization inhibitor) | 0.3 part |
| D | Methanol (stopping agent) | 32 parts |

A solution of a urethane diacrylate compound was obtained according to the above recipe in the same manner as in Example 10-(a). Thereafter, it was dried under reduced pressure to obtain a viscous urethane diacrylate compound (XI).

(b) Production of a photosensitive element and formation of a soldering mask

| The urethane diacrylate compound (XI) obtained in the manner described above | 50 parts |
|---|---|
| Methyl methacrylate-methyl acrylate-acrylic acid-tetrahydrofurfuryl methacrylate-tribromophenyl acrylate (40/23/2/10/25 weight ratio) copolymer (having a molecular weight of about 80,000, a glass transition temperature of about 75° C. and a bromine content of 15%) | 47 parts |
| Benzophenone | 2.7 parts |
| Michler's ketone | 0.3 part |
| 2,2'-Methylenebis(4-methyl-6-t-butylphenol) | 0.5 part |
| Victoria pure blue | 0.02 part |
| Methyl ethyl ketone | 100 parts |
| Toluene | 50 parts |

The same procedures as in Example 10-(b) and Example 10-(c) were followed, with the exception that a solution of a photosensitive resin composition prepared from the above recipe was used. The finally obtained protective coating film showed no defect in the immersion test for 10 minutes in isopropanol, toluene, trichlene or a 10% aqueous hydrochloric acid solution all at 25° C., and underwent no change such as peeling-off and cracking when immersed in a soldering bath at 255° to 265° C. for 30 seconds. It did not crack also in the thermal shock test of 20 cycles under MIL-STD-202E method 107D condition B after the same soldering treatment as in Example 9-(c). A protective coating film was formed by the same procedure as in the above on the whole surface of a substrate of 1.6 mm in thickness of a printed wiring substrate MCL-E-68 manufactured by Hitachi Chemical Co., Ltd. This coating film satisfied the standards of 94V-1 of UL.

EXAMPLE 14

The same procedure as in Example 13 was followed, with the exception that 1 part of antimony trioxide was additionally incorporated into the solution of a photosensitive resin composition in Example 13-(b). The finally obtained protective coating film was as good as in Example 13-(b) in solvent resistance, heat resistance and resistance to thermal shock. A protective coating film was formed by the same procedure as in the above on the whole surface of a substrate of 1.6 mm in thickness of a printed wiring substrate MCL-E-68 manufactured by Hitachi Chemical Co., Ltd. This coating film satisfied the standards of 94V-0 of UL.

EXAMPLE 15

(a) Synthesis of a urethane dimethacrylate compound

| A | Isophorone diisocyanate | 1,776 parts (16 equivalents) |
|---|---|---|
|   | Toluene (solvent) | 1,000 parts |
|   | Di-n-butyl tin dilaurate (catalyst) | 1 part |
| B | 1,4-Butanediol | 360 parts (8 equivalents) |
| C | 2-Hydroxyethyl methacrylate | 1,040 parts (8 equivalents) |
|   | Toluene (solvent) | 280 parts |
|   | Hydroquinone (thermopolymerization inhibitor) | 0.3 part |
| D | Methanol (stopping agent) | 32 parts |

A solution of a urethane diacrylate compound was obtained according to the above recipe in the same manner as in Example 9-(a). Thereafter, it was dried under reduced pressure to obtain a viscous urethane dimethacrylate compound (XII).

(b) Production of a photosensitive element and formation of a soldering mask

| The urethane dimethacrylate compound (XII) obtained in the manner described above | 40 parts |
|---|---|
| Methyl methacrylate-methacrylic acid-tetrahydrofurfuryl methacrylate-acrylonitrile-tribromophenyl acrylate (43/2/20/5/30 weight ratio) copolymer (having a molecular weight of 150,000, a glass transition temperature of about 100° C. and a bromine content of 18% by weight) | 57 parts |
| Benzophenone | 2.7 parts |
| Michler's ketone | 0.3 part |
| p-Methoxyphenol | 0.05 part |
| Victoria pure blue | 0.05 part |
| Toluene | 150 parts |

The same procedures as in Example 10-(b) and Example 10-(c) were followed, with the exception that a solution of a photosensitive resin composition prepared from the above recipe was used. The finally obtained protective coating film showed no defect in the immersion test for 10 minutes in isopropanol, toluene, trichlene or a 10% aqueous hydrochloric acid solution all at 25° C., and underwent no change such as peeling off and cracking when immersed in a soldering bath at 255° to 265° C. for 30 seconds. Further, it did not crack also in the thermal shock test of 20 cycles under MIL-STD-202E method 107D condition B after the same soldering treatment as in Example 9-(c). A protective coating film was formed by the same procedure as in the above on the whole surface of a substrate of 1.6 mm in thickness of a printed wiring substrate MCL-E-68 manufactured by Hitachi Chemical Co., Ltd. This coating film satisfied the standards of 94V-1 of UL.

EXAMPLE 16

(a) Synthesis of a urethane diacrylate compound

| A | Isophorone diisocyanate | 1,776 parts (16 equivalents) |
|---|---|---|
|   | Toluene (solvent) | 1,000 parts |
|   | Di-n-butyl tin dilaurate (catalyst) | 1 part |
| B | 1,4-Cyclohexanedimethanol | 216 parts (3 equivalents) |
|   | Tetraethylene glycol | 291 parts (3 equivalents) |
|   | Methyl ethyl ketone (solvent) | 200 parts |
| C | 2-Hydroxyethyl | 1,160 parts (10 equivalents) |
|   | Toluene (solvent) | 200 parts |
|   | p-Methoxyphenol (thermopolymerization inhibitor) | 0.2 part |
| D | Methanol | 32 parts |

A solution of a urethane diacrylate compound was obtained according to the above recipe in the same manner as in Example 9-(a). Thereafter, it was dried under reduced pressure to obtain a viscous urethane diacrylate compound (XIII).

(b) Production of a photosensitive element

| The urethane diacrylate compound (XIII) obtained in the manner described above | 47 parts |
|---|---|
| Methyl methacrylate-methyl acrylate-acrylic acid-tetrahydrofurfuryl methacrylate-2-hydroxyethyl methacrylate-tribromophenyl acrylate (43/10/2/5/5/35 weight ratio) copolymer (having a molecular weight of about 150,000, a glass transition temperature of about 90° C. and a bromine content of 22% by weight) | 50 parts |
| Benzophenone | 2.7 parts |
| Michler's ketone | 0.3 part |
| p-Methoxyphenol | 0.05 part |
| Victoria pure blue | 0.02 part |
| KAYAMER PA-2 (manufactured by Nihon Kayaku Co., Ltd., a divalent acrylate containing a phosphoric acid group) | 0.1 part |
| Methyl ethyl ketone | 50 parts |
| Toluene | 100 parts |

By the use of a solution of a photosensitive resin composition prepared from the above recipe, a photosensitive element in which the thickness of a layer of the photosensitive resin composition was about 50 μm was obtained by using, as in Example 10-(b), an apparatus shown in FIG. 3.

(c) Formation of a soldering mask

The photosensitive element obtained in the above was laminated, under reduced pressure in the same manner as in Example 10-(c), on a printed wiring board for test on which a copper pattern (copper thickness: about 18 μm) shown in FIG. 1 had been formed. After the lamination, and printed wiring boards were allowed to stand at room temperature for 3 hours, and then exposed, as in Example 9-(c), at 200 mJ/cm² through a negative mask for test shown in FIG. 2. After the exposure, the boards were heated at 80° C. for 5 minutes and then allowed to cool at room temperature for 20 minutes, after which the support film was peeled off, and the boards were subjected to spray development at 20° C. for 70 seconds by using 1,1,1-trichloroethane. After the development, the boards were heated and dried at 80° C. for 30 minutes, and further heated at 120° C. for 30 minutes and then at 150° C. for 30 minutes. The heated boards were allowed to cool at room temperature for 10 minutes, irradiated with ultraviolet light at 10 J/cm², and then heat-treated at 130° C. for 2 hours. The test substrates on which a protective coating film was thus formed were subjected to the immersion test for 10 minutes in isopropanol, toluene, trichlene or a 10% aqueous hydrochloric acid solution all at 25° C. in the same manner as in Example 9-(c) to find that the protective coating film showed no defect. The protective coating film did not peel off in the immersion test for 30 seconds in a soldering bath at 255° to 265° C., and hence was good in heat resistance. Further, it did not crack in the thermal shock test of 20 cycles under MIL-STD-202E method 107D condition B after the same soldering treatment as in Example 9-(c). The protective coating film did not peel off in the cross-cutting test, and hence is excellent in adhesion. A protective coating film was formed by the same procedure as in the above on the whole surface of a substrate of 0.8 mm in thickness of a printed wiring substrate MCL-E-68 manufactured by Hitachi Chemical Co., Ltd. This coating film satisfied the standards of 94V-1 of UL.

COMPARATIVE EXAMPLE 8

A urethane diacrylate compound was synthesized in the same manner as in Example 9-(a), except that 1,344 parts (16 equivalents) of hexamethylene diisocyanate was substituted for 1,776 parts (16 equivalents) of the isophorone diisocyanate. The produced urethane diacrylate compound (XIV) was insoluble in toluene, the reaction solvent, and separated as wax just as it was produced. The obtained urethane diacrylate compound (XIV) was slightly soluble in methyl ethyl ketone and 1,1,1-trichloroethane, and soluble in acetone and chloroform.

| | |
|---|---|
| The urethane diacrylate compound (XIV) obtained in the above | 50 parts |
| The copolymer used in Example 9-b | 47 parts |
| Benzophenone | 2.7 parts |
| Michler's ketone | 0.3 part |
| p-Methoxyphenol | 0.05 part |
| Victoria pure blue | 0.02 part |
| Acetone | 50 parts |
| Chloroform | 100 parts |

A solution of a photosensitive resin composition prepared from the above recipe was applied to a polyethylene terephthalate film by using, as in Example 10-(b), an apparatus shown in FIG. 3, and then dried in hot air to find that the urethane diacrylate compound (XIV) and the copolymer separated from each other just as the solvent was dried, so that no desirable photosensitive element could be obtained. When any of the copolymers used in Examples 10 to 16 was used, the miscibility was as low as in the above, and no desirable photosensitive element could be obtained.

As explained in detail in Examples, the photosensitive resin composition and the photosensitive element of this invention give a protective coating film excellent in heat resistance, resistance to thermal shock and solvent resistance, and the given protective coating film is suitable as a soldering mask which is required to have long-term reliability.

The above is nothing but an example of the photosensitive resin composition and the photosensitive element of this invention, and needless to say, various changes and modifications may be made therein without departing from the spirit of scope of this invention.

What is claimed is:

1. A photosensitive resin composition forming a soldering mask comprising:
    (a) 20 to 75 parts by weight of at least one urethane diacrylate or urethane dimethacrylate compound which has acryloyl or methacryloyl groups in an amount of $1 \times 10^{-3}$ to $4.3 \times 10^{-3}$ equivalent/g. and which is obtained by reacting
        (i) at least one diisocyanate compound selected from the group consisting of trimethylhexamethylene diisocyanate and isophorone diisocyanate,
        (ii) a dihydric alcohol, and
        (iii) an acrylic or methacrylic monoester of a dihydric alcohol,
    (b) 20 to 75 parts by weight of a linear polymer having a glass transition temperature of about 40° to 150° C., and
    (c) a sensitizer and/or a sensitizer system which generate free radicals owing to actinic light in an amount of 0.5 to 10% by weight based on the total amounts of components (a) and (b); said composition having been heated to 80° to 200° C. and exposed to actinic light after development by imagewise exposure and treatment with a developing solution.

2. A composition according to claim 1, wherein the diisocyanate compound (i) is trimethylhexamethylene diisocyanate.

3. A composition according to claim 1, wherein the diisocyanate compound (i) is isophorone diisocyanate.

4. A composition according to claim 1, wherein the urethane diacrylate or dimethacrylate compound (a) is represented by the following formula:

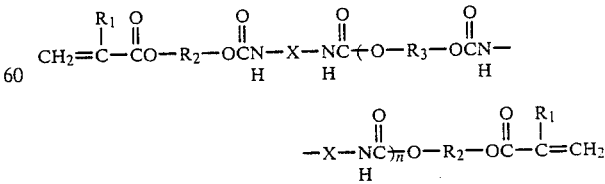

wherein $R_1$ is H or $CH_3$; $R_2$ is a residue of a dihydric alcohol; $R_3$ is a residue of a dihydric alcohol; X is a residue of isophorone diisocyanate or a trimethylhexamethylene group; and n is zero or a positive integer of 1 to 3.

5. A composition according to claim 1, wherein the dihydric alcohol of (ii) and that in (iii) have 1 to 23 carbon atoms.

6. A composition according to claim 1, wherein the dihydric alcohol of (ii) is 1,4-butanediol, 1,3-butanediol, 1,5-pentanediol, 1,6-hexanediol or 1,4-cyclohexanedimethanol.

7. A composition according to claim 1, wherein the acrylic or methacrylic monoester (iii) of a dihydric alcohol is hydroxyethyl acrylate, hydroxyethyl methacrylate, hydroxypropyl acrylate or hydroxypropyl methacrylate.

8. A composition according to claim 1, wherein the linear polymeric compound (b) is a vinyl series copolymer.

9. A composition according to claim 1, wherein the linear polymeric compound (b) contains bromine atoms in an amount up to 40% by weight.

10. A composition according to claim 1, wherein the linear polymeric compound (b) contains 5 to 65% by weight of tribromophenyl acrylate or tribromophenyl methacrylate as a copolymer component.

11. A composition according to claim 1, which additionally contains
(d) an acrylic or methacrylic ester containing a phosphoric acid group in the molecule in an amount of 0.01 to 5% by weight based on the total amount of components (a) and (b).

12. A composition according to claim 1, which additionally contains antimony trioxide in an amount up to 5% by weight.

13. A photosensitive element forming a soldering mask comprising (I) a layer of a photosensitive resin composition comprising
(a) 20 to 75 parts by weight of at least one urethane diacrylate or urethane dimethacrylate compound which has acryloyl or methacryloyl groups in an amount of $1 \times 10^{-3}$ to $4.3 \times 10^{-3}$ equivalent/g. and which is obtained by reacting
  (i) at least one diisocyanate compound selected from the group consisting of trimethylhexamethylene diisocyanate and isophorone diisocyanate,
  (ii) a dihydric alcohol and
  (iii) an acrylic or methacrylic monoester of a dihydric alcohol,
(b) 20 to 75 parts by weight of a linear polymer having a glass transition temperature of about 40° C. to 150° C., and
(c) a sensitizer and/or a sensitizer system which generate free radicals owing to actinic light in an amount of 0.5 to 10% by weight based on the total amounts of components (a) and (b); said composition having been heated to 80° to 200° C. and exposed to actinic light after development by imagewise exposure and solvent treatment, and (II) a support film supporting said layer.

14. A photosensitive element according to claim 13, wherein the diisocyanate compound (i) in the layer (I) of the photosensitive resin composition is trimethylhexamethylene diisocyanate.

15. A photosensitive element according to claim 13, wherein the diisocyanate compound (i) in the layer (I) of the photosensitive resin composition is isophorone diisocyanate.

16. A photosensitive element according to claim 13, wherein the urethane diacrylate or dimethacrylate compound (a) in the layer (I) of the photosensitive resin composition is represented by the following formula:

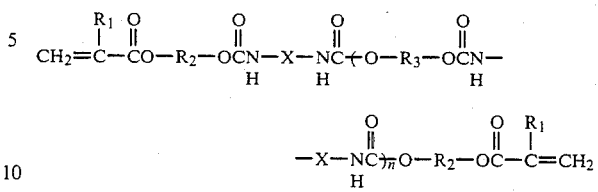

wherein $R_1$ is H or $CH_3$; $R_2$ is a residue of a dihydric alcohol; $R_3$ is a residue of a dihydric alcohol; X is a residue of isophorone diisocyanate or a trimethylhexamethylene group; and n is zero or a positive integer.

17. A photosensitive element according to claim 13, wherein the dihydric alcohol of (ii) and that in (iii) in the layer (I) of the photosensitive resin composition have 1 to 23 carbon atoms.

18. A photosensitive element according to claim 13, wherein the dihydric alcohol of (ii) in the layer (I) of the photosensitive resin composition is 1,4-butanediol, 1,3-butanediol, 1,5-pentanediol, 1,6-hexanediol or 1,4-cyclohexanedimethanol.

19. A photosensitive element according to claim 13, wherein the acrylic or methacrylic monoester (iii) in the layer (I) of the photosensitive resin composition is hydroxyethyl acrylate, hydroxyethyl methacrylate, hydroxypropyl acrylate or hydroxypropyl methacrylate.

20. A photosensitive element according to claim 13, wherein the linear polymeric compound (b) in the layer (I) of the photosensitive resin composition is a vinyl series copolymer.

21. A photosensitive element according to claim 13, wherein the linear polymeric compound (b) in the layer (I) of the photosensitive resin composition contains bromine atoms in an amount up to 40% by weight.

22. A photosensitive element according to claim 13, 20 or 21, wherein the linear polymeric compound (b) in the layer (I) of the photosensitive resin composition contains 5 to 65% by weight of tribromophenyl acrylate or tribromophenyl methacrylate as a polymerization component.

23. A photosensitive element according to claim 13, wherein the layer (I) of the photosensitive resin composition additionally contains (d) an acrylic or methacrylic ester containing a phosphoric acid group in the molecule in an amount of 0.01 to 5% by weight based on the total amount of components (a) and (b).

24. A photosensitive element according to claim 13, wherein the layer (I) of the photosensitive resin composition additionally contains antimony trioxide in an amount up to 5% by weight.

25. A photosensitive element according to claim 13, wherein the layer (I) of the photosensitive resin composition has a thickness of 20 to 200 μm.

26. A photosensitive element according to claim 13, wherein the support film (II) is a polyester film, a polyimide film, a polyamide-imide film, a polypropylene film or a polystyrene film.

27. A photosensitive element according to claim 13, which further laminates a releasable covering film on the layer (I) of the photosensitive resin composition.

28. A composition according to claim 1, wherein the urethane diacrylate or dimethacrylate compound (A) is obtained by effecting reaction of components (i), (ii) and (iii) at a temperature from 40° to 100° C.

* * * * *